United States Patent [19]

Hebenstreit

[11] 4,162,539

[45] Jul. 24, 1979

[54] READ-OUT CIRCUIT FOR DIGITAL STORAGE ELEMENTS

[75] Inventor: Ernst Hebenstreit, Munich, Fed. Rep. of Germany

[73] Assignee: Siemens Aktiengesellschaft, Berlin & Munich, Fed. Rep. of Germany

[21] Appl. No.: 921,496

[22] Filed: Jul. 3, 1978

[30] Foreign Application Priority Data

Jul. 28, 1977 [DE] Fed. Rep. of Germany ....... 2734137

[51] Int. Cl.² ............................................. G11C 11/24
[52] U.S. Cl. .................................... 365/149; 365/189; 365/73
[58] Field of Search .................. 365/149, 150, 189, 73; 307/110; 320/1

[56] References Cited

U.S. PATENT DOCUMENTS

| | | | |
|---|---|---|---|
| 3,249,748 | 5/1966 | Fluhr | 320/1 |
| 3,271,651 | 9/1966 | Diederich | 320/1 |
| 3,354,449 | 11/1967 | McGregor | 320/1 |
| 3,441,913 | 4/1969 | Pastoriza | 320/1 |

Primary Examiner—Terrell W. Fears
Attorney, Agent, or Firm—Hill, Van Santen, Steadman, Chiara & Simpson

[57] ABSTRACT

A read-out circuit for digital storage elements wherein a bit line can be connected to a storage capacitor which is connected to the input of a first inverting amplifier stage and the output of the amplifying stage is connected to the input of a second inverting amplifier stage and wherein the first amplifier stage can be bridged by way of a first switch and the output of the second amplifier stage can be connected to the input of the first amplifier by way of a second switch and wherein the input of the first amplifier stage and the output of the second amplifier stage are connected together by way of a capacitor.

6 Claims, 3 Drawing Figures

READ-OUT CIRCUIT FOR DIGITAL STORAGE ELEMENTS

BACKGROUND OF THE INVENTION

1. Field of the Invention

This invention relates in general to a read-out circuit for digital storage elements.

2. Description of the Prior Art

The publications entitled "Electronic Design" No. 6 of 15th March 1973 at pages 28 and 29 and the publication "Siemens Forschungs- und Entwicklungsberichten" Vol. 4, 1975, No. 4, pages 197 to 202 and in particular FIG. 2 disclose storage means for digital information which is represented by the presence or absence of an electrical charge in a storage capacitor. Prior to read-out of information the bit line is first brought as a result of a temporary closure of a first switch to a neutral starting potential which is between the potentials that correspond to the two differing digital signals. Subsequently, the bit line is connected generally by way of a switching transistor to the storage capacitor which is to be read out and depending on the storage content a recharging between the storage capacitor and the line capacitance of the bit line is accomplished in one or the other directions. The recharging causes a reduction or a raising of the potential at the input of the first inverting amplifier stage. If the second switch is then closed, the two amplifier stages form a flip-flop circuit which is triggered into one or the other stable state as the result of the change in the potential at the input of the first amplifier stage. The potential at the input of the first stage is then further displaced in the original direction of change so that a signal regeneration occurs at the input of the first amplifier stage. Electrical signals which are inverse to one another and which represent the information to be read out can then be taken from the outputs of the amplifier stages. One of these signals which can also be removed from the bit line is re-entered into the storage capacitor as a regenerated signal before the storage capacitor is cut off from the bit line by the switching transistor.

The prior art read-out circuits of this type do not always fulfill the requisite requirements relative to their sensitivity response and the operating speed. This is because the tolerance dependent differences in the characteristic values of the two inverting amplifier stages cause a potential difference to occur between the output of the second stage and the input of the second stage which causes a jump in potential at the input of the first stage when these circuit points are connected by way of the second switch. As this potential jump is superimposed upon the useful signal fed back by way of the second switch and is an interference signal the onely useful signal switch can be clearly analyzed are those which possess a predetermined signal to noise ratio. Due to the recharging process occurring on the bit line, the useful signal builds up only gradually, however, so that when the second switch is closed and upon the commencement of the feed back action of the flip-flop circuit, it is necessary to wait until the requisite useful signal amplitude is reached.

SUMMARY OF THE INVENTION

The present invention comprises an improvement upon the known read-out circuits of the prior art.

The present invention has the advantage that even before the closure of the second switch the information related potential changes at the input of the first amplifier stage are supplied to a flip-flop circuit which is capacitively closed between the output of the second stage and the input of the first stage and which is not impaired in function by tolerance related potential differences at the output of the stages. A rapid rise occurs in the useful signal amplitudes so that when the second switch is closed a signal to noise ratio will have already been reached which insures the desired functional reliability of the circuit in spite of a greater response sensitivity and higher operating speed.

A further embodiment of the invention utilizes a second bit line which can be connected to a further storage capacitor that is connected to the input of the second amplifier stage and the second amplifier stage is capable of being bridged with a third switch and a fourth switch is connected between the output of the first amplifier stage and the input of the second amplifier stage and an additional capacitor connected between the input of the second amplifier stage and the output of the first amplifier stage.

Other objects, features and advantages of the invention will be readily apparent from the following description of certain preferred embodiments thereof taken in conjunction with the accompanying drawings although variations and modifications may be effected without departing from the spirit and scope of novel concepts of the disclosure and in which:

DESCRIPTION OF THE PREFERRED EMBODIMENTS

Figure 1:
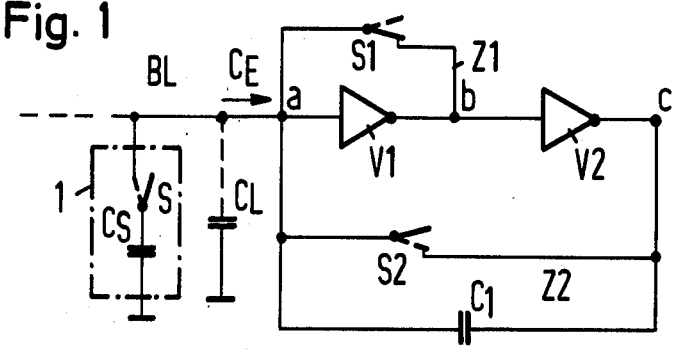
FIG. 1 is a circuit diagram illustrating the invention.

FIG. 1 illustrates a digital semiconductor storage means 1 comprising a capacitor $C_S$ with one side connected to ground and the other side connected to a switch S. The storage means 1 includes a storage capacitor $C_S$ which stores a bit of digital information indicated by the presence or absence of an electrical charge. The information is written into and read out of the storage means 1 by means of a bit line BL that is connected to the electrical switch S that might, for example, be a switching transistor. The line capacitance of the bit line BL relative to earth is indicated in FIG. 1 by the dash line capacitance $C_L$ which has one side connected to ground and the other connected with dash lines to the bit line BL. Line BL connects to the input a of a first inverting amplifier stage $V_1$. The output of the amplifier stage $V_1$ is indicated by b and is connected to the input of a second inverting amplifier stage $V_2$ whose output is indicated by c. The amplifier stages V1 and V2 are selected so that their characteristics are as equal as possible. An electronic switch S1 is mounted in a branching arm Z1 which connects circuit points a and b. An electronic switch S2 is mounted in a circuit arm Z2 between points a and c. A capacitor $C_1$ is connected between point a and point c.

At the time the bit of digital information contained in the storage element 1 is to be read out by way of bit line BL the switch S1 is closed. As a result, the circuit points a and b are brought to the same potential which lies between those potential values which are assumed by the electrode not connected to reference potential of the storage capacitor $C_S$ when a logic "1" or "0" is stored. The switch S1 is then opened as shown in broken line position in FIG. 1 and the switch S is closed and depending on the form of the stored information, a recharging occurs between the capacitors $C_S$ and $C_L$ in one or the other directions. As a result, the potential of the circuit point a is displaced towards higher or lower values whereas the potential of point b is displaced accordingly toward lower or higher values and the potential of point c is displaced toward higher or lower potential values. As the potential changes at point c can be communicated by way of the capacitor $C_1$ to the input point a of the first amplifier stage V1, these potential changes will cause the circuit to operate as a flip-flop circuit which is capacitively coupled between points a and c. This means that the circuit points a, b and c very rapidly move toward the stable potential states by which they are characterized depending upon the information related initial potential displacement at point a. If a displacement of this kind at the circuit point a occurs, for example, towards higher potential values in the final state a high potential value will be reached across point a and point c which is only slightly below the supply voltage supplied to the amplifier stages and the potential of point b will fall to a minimum value which corresponds approximately to the reference potential. Any difference in potential between points a and b which is due to characteristic value differences of the amplifier stages V1 and V2 will not disturb the triggering of the capacitively closed flip-flop circuit.

During the described recharging process between the capacitors $C_s$ and $C_L$ in the associated potential displacements at points a,b and c, the switch S2 which until such time has been opened is closed or moved to the broken line position shown in FIG. 1 so that the feedback function of the flip-flop circuit is additionally maintained by way of the switch S2 when due to a substantially matching of the potentials across capacitor $C_s$ and $C_L$ the potential change at point a will have slow downed to such an extent that the feedback effect by way of capacitor C1 becomes of less significance.

In prior art read out circuits, the starting of the feedback effect of the flip-flop circuit necessitates the closure of a switch S2 which simultaneously gives rise to the occurrence of interference signals in the feedback arm which are due to potential differences between points a and c following the bridging of amplifier V1. The useful circuit fed back from point c to point a in prior art systems requires a relatively high amplitude so as to avoid mistakes in detection. However, this also means a relatively response sensitivity of the circuit. In contrast, the circuit of the prior invention which is in parallel with capacitor C1 ensures a neutral starting position and an interference free feedback function of the flip-flop even prior to the closure of switch S2. Therefore, even slight information related potential displacements at the circuit point a can be satisfactorily analyzed by the read-out circuit of the invention. On the other hand, the feedback effect which occurs even prior to the closure of switch S2 gives rise to a very rapid establishment of the potential end state at point a and point c.

The input capacitance $C_E$ of the read-out circuit taking into account C1 but disregarding the transistor-input capacitances contained in V1 and V2 is equal to $$C_E = C_1(1 - v_1^2)$$

where $v_1$ is the amplification factor of stage V1 and and V2. When $v_1$ is selected so that it is greater than 1, $C_E$ assumes a negative value which forms a partial compensation of the line capacitance $C_L$. This, subsequently, results in an increased signal range, in other words, an increased potential difference between the two logic signals on bit line BL. If, for example, the above discussed partial compensation produces a reduction of $C_L$ to one-fifth of its original value the signal range will be increased five times. With an assumed amplification factor of $v_1 = 3$, this increase is achieved when C1 corresponds to one tenth of the line capacitance $C_L$.

Figure 2:
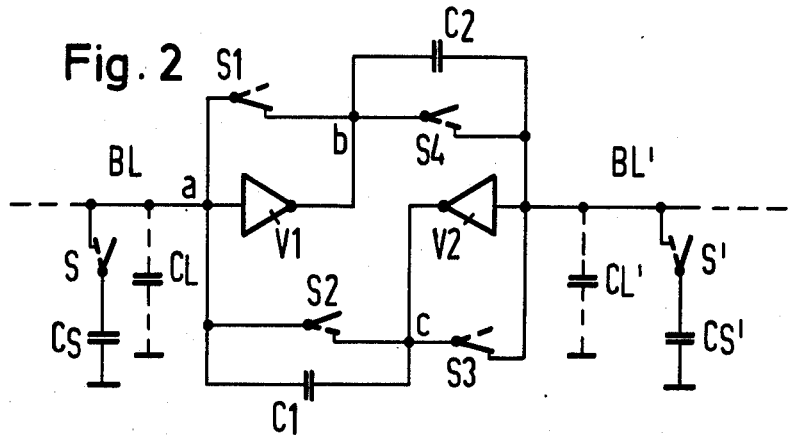
FIG. 2 illustrates a modification of the invention.

FIG. 2 illustrates a further embodiment of the circuit shown in FIG. 1 in which the input of the second inverting amplifier stage V2 is connecrted to an additional bit line BL' which for the write-in and read-out of digital bits of information can be connected by way of an electronic switch S' to a further storage capacitor $C'_S$. The circuit elements described and occurring in the circuit of FIG. 1 are indicated by the same characters in FIG. 2 and the circuit has been redrawn for purposes of clarity and to facilitate the addition of additional switches. Additional components not shown in FIG. 1 in the circuit of FIG. 2 comprise the second bit line BL' and the second storage device $C_S'$ and switch S' as well as a switch S3 which when closed connects the output of amplifier V2 to its input. A switch S4 is connected between the output of amplifier V1 point b and the input to amplifier V2. A capacitor $C_2$ is connected in parallel with the switch S4.

The read-out of the digital information stored in capacitor $C_s$ can be accomplished in the same manner described with reference to the circuit of FIG. 1 although during the interruption phase of the switch S2 when the switch S2 is opened, the switch S4 is operated in synchronism with switch S2 and only the potential displacement at the output point b of amplifier V1 is supplied to the input of V2 by way of the capacitor C2. Thus, during this switching phase of switches S2 and S4, a capacitively closed flip-flop circuits exist between capacitors C1 and C2. The read-out of a bit of digital information from the storage capacitor $C_S'$ by way of bit line of BL' is carried out in a similar manner although the switch S3 is first closed so as to set the bit line BL' at the potential at the input and output of amplifier V2. Following the opening of switch S3 and the closure of switch S', the feedback processes within the flip-flop circuit first takes place only by way of capacitors C1 and C2 and then following the closure of switches S2 and S4 to an increasing extent by way of these switches. The advantages relative to sensitivity and operating speed discussed relative to FIG. 1 are also obtained with the circuit of FIG. 2.

Figure 3:
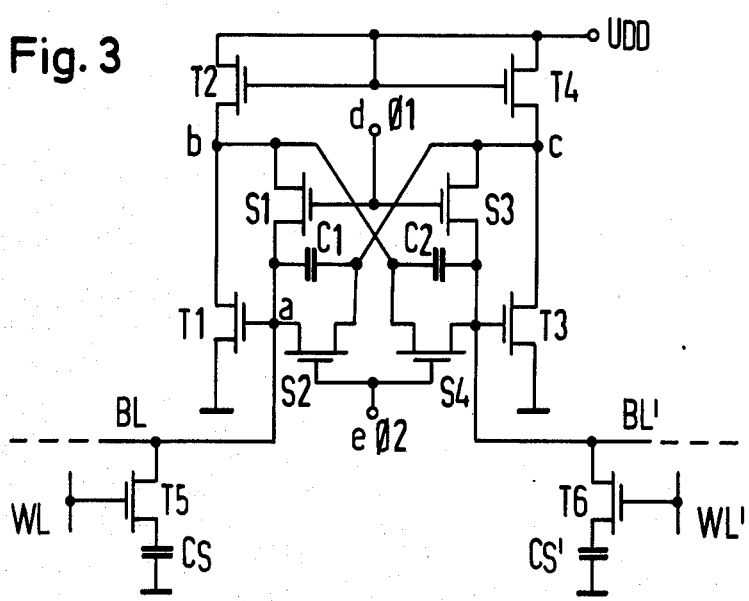
FIG. 3 is an electrical schematic illustrating in detail the embodiment of FIG. 2.

FIG. 3 is a preferred actual circuit embodiment of the circuit shown in FIG. 2 which can be constructed as a monolithically integrated semiconductor circuit employing MIS-field effect transistors. MIS-field effect transistors as used herein means transistors in which the gate electrode is arranged in insulated fashion above a channel zone which is arranged on the surface of a doped semiconductor layer and which extends between oppositely doped surface source and drain zones. The amplifier V1 in FIG. 3 consists of a switching transistor T1 and a transistor T2 which is utilized as a load element and the source-drain path of transistors T1 and T2 are connected in series with one another between a reference potential and a supply voltage $U_{DD}$. The source potential T1 is connected to the reference ground potential and the gate electrode of transistor T2 is connected to the drain terminal of transistor T2. The second amplifier stage V2 illustrated in FIG. 2 is embodied in the transistors T3 and T4 in the practical embodiment of FIG. 3 which are connected in series between the ground reference potential and the supply voltage $U_{DD}$ as shown. The sources of the transistors T1 and T3 are connected to ground and the drains of transistors T1 and T3 are respectively connected to the sources of the transistors T2 and T4. In the embodiment of FIG. 3, the switches S, S' and S1, S2, S3 and S4 shown in FIG. 2, are embodied in the MIS-field effect transistors and the transistors which represent switches S1 and S3 are actuated by way of a common gate terminal d by a timing signal $\phi 1$ whereas the transistors which represent the switches S2 and S4 are actuated by way of a common gate terminal e by means of a timing signal $\phi 2$ which is supplied to the terminal e. The storage capacitor $C_S$ is connected to the bit line BL by way of a switching transistor T5 which can be controlled by means of a signal fed to its gate with a word line WL. The capacitor $C_S'$ is connected to the bit line BL' by way of a switching transistor T6 which can be operated with a word line WL' connected to its gate electrode.

It is particularly advantageous to design the capacitors C1 and C2 so that their first electrodes each consist of a part of the bit lines BL and BL' which may be designed as strip-like oppositely doped semiconductor zones. The second electrodes of the capacitors C1 and C2 may consist of parts of a conductive coating which is applied between the bit lines and separated from the bit lines by an insulating layer. This conductive coating consists either of a highly doped semiconductor material, such as polycrystalline silicon or may be a metallic layer consisting, for example of aluminum.

In operation, the signals applied at terminals e and d result in the circuit of FIG. 3 operating in the manner described above relative to FIGS. 1 and 2 wherein the transistor T5 corresponds to the switch S, the transistor T6 corresponds to the switch S'. The transistor S1 corresponds to the switch S1 in FIG. 2, the transistor S2 corresponds to the switch S2 in FIG. 2, the transistor S3 in FIG. 3 corresponds to the switch S3 in FIG. 2 and the transistor S4 in FIG. 3 corresponds to the switch S4 in FIG. 2.

Although the invention has been described with respect to preferred embodiments, it is not to be so limited as changes and modifications can be made which are within the full intended scope of the invention as defined by the appended claims.

I claim as my invention:

1. A read-out circuit for digital storage elements wherein a bit line is connected to a storage capacitor is connected to the input of a first inverting amplifier stage which has its output connected to the input of a second inverting amplifier stage, and wherein the first amplifier stage can be bridged with a first switch, and wherein the output of the second amplifier stage can be connected to the input of the first amplifier stage by way of a second switch, characterized in that the input (a) of the first amplifier stage (V1) and the output (c) of the second amplifier stage (V2) are connected to one another through a capacitor (C1).

2. A read-out circuit as claimed in claim 1, characterized in that a second bit line (BL') is connected to a further storage capacitor ($C_s'$) which is connected to the input of said second amplifier stage (V2), and said second amplifier stage (V2) can be bridged with a third switch (S3) and a fourth switch (S4) connected between the output (b) of said first amplifier stage (V1) and the input of said second amplifier stage (V2), and the input of the second amplifier stage (V2) and the output (b) of the first amplifier stage (V1) are connected to one another through a further capacitor ($C_2$).

3. A read-out circuit as claimed in claim 1 characterized in that said first and second amplifier stages (v1, V2) are constructed with MIS-field effect transistors (T1 to T4).

4. A read-out circuit as claimed in claim 3, characterized in that said switches (S1 to S4) consist of MIS-field effect transistors.

5. A read-out circuit as claimed in claim 4, characterized in that it is constructed as a monolithically integrated semiconductor circuit.

6. A read-out circuit as claimed in claim 5, characterized in that the capacitors ($C_1$, $C_2$), by way of which the output of the one inverting amplifier stage (V2, V1) is connected to the input of the other inverting amplifier stage (V1, V2) are designed to be such that one of their electrodes consists of a part of the bit line (BL, BL') which connects to the amplifier input.

* * * * *